(12) United States Patent
Yeh et al.

(10) Patent No.: US 6,989,578 B2
(45) Date of Patent: Jan. 24, 2006

(54) INDUCTOR Q VALUE IMPROVEMENT

(75) Inventors: Tzu-Jin Yeh, Hsinchu (TW); Hsien-Chang Wu, Sinjhuang (TW); Ming-Ta Yang, Hsinchu (TW); Yu-Tai Chia, San Jose, CA (US)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 30 days.

(21) Appl. No.: 10/632,456

(22) Filed: Jul. 31, 2003

(65) Prior Publication Data

US 2005/0023639 A1   Feb. 3, 2005

(51) Int. Cl.
    *H01L 29/41*   (2006.01)
(52) U.S. Cl. .................................... 257/531
(58) Field of Classification Search ............... 257/531
    See application file for complete search history.

(56) References Cited

U.S. PATENT DOCUMENTS

| | | | |
|---|---|---|---|
| 5,952,704 A * | 9/1999 | Yu et al. ................... | 257/531 |
| 6,008,713 A | 12/1999 | Nasserbakht | |
| 6,143,614 A | 11/2000 | Nasserbakht | |
| 6,225,677 B1 * | 5/2001 | Kobayashi .................. | 257/531 |
| 6,495,903 B2 | 12/2002 | Xu et al. | |
| 6,535,101 B1 | 3/2003 | Ahn et al. | |
| 6,753,591 B2 * | 6/2004 | Yu ............................. | 257/531 |

* cited by examiner

*Primary Examiner*—Gene M. Munson
(74) *Attorney, Agent, or Firm*—Duane Morris LLP

(57) ABSTRACT

An inductor in an integrated circuit comprises a conductive trace disposed over an insulating layer which overlies a semiconductor substrate of a first conductivity type and at least two deep wells of opposite conductivity type in the substrate underneath the track. In another embodiment, an inductor in an integrated circuit comprises a conductive trace disposed over an insulating layer which overlies a semiconductor substrate of a first conductivity type; a shallow trench isolation region formed in the substrate underneath the trace; and at least two deep wells of opposite conductivity type in the substrate underneath the shallow trench isolation region. The present invention also includes methods of manufacturing the aforementioned inductors.

24 Claims, 20 Drawing Sheets

INDUCTOR Q VALUE IMPROVEMENT

FIELD OF THE INVENTION

The present invention relates to integrated circuits and more particularly to inductors and methods of manufacture therefore.

BACKGROUND

Inductors store energy in a magnetic field produced by current through a wire coil and are often used to form radio frequency (RF) circuits. The need to miniaturize electronic circuits applies to RF circuits because of the demand for semiconductor chips used in cellular phones and wireless modem. Although many other digital and analog circuits, such as operational amplifiers and microprocessors, have been successfully implemented in integrated circuits. RF circuits remain, however, a challenge to miniaturization of electronic circuits.

The difficulty of fabricating high quality factor (Q value) inductors in integrated circuits which are suitable for RF applications arises mainly because semiconductor substrates induce energy loss. The low energy consumption is also a concern for inductors employed in devices such as cellular phones and wireless modems.

Because Q value is directly proportional to the inductance (L) and the angular frequency ($\omega$), and inversely proportional to the resistance (R). High Q value designs strive to increase the inductance and decrease the resistance, while keeping parasitic capacitance to a minimum so that high oscillation frequencies can be achieved.

RF circuits demand inductors with high inductance values. However, high inductance values necessitate a large silicon chip area which prevent miniaturization of such circuits. Moreover, the enlarged area of a conductive trace increases the parasitic capacitance which reduces resonant angular frequency of oscillation and Q value.

One way of improving the self resonance frequency and Q value of an inductor is to create an air gap underneath the conductive trace by etching away the semiconductor substrate. This, however, causes the inductor to be effectively suspended without support. Other techniques also have been developed in the semiconductor industry but with limited results. For example, a known technique employs wide metal lines. Unfortunately, because both the inductor area and the parasitic capacitance are increased, the oscillation frequency decreases and, thus, the useful frequency range is limited.

Accordingly, there is a need for further downsizing of induction elements, operating at high RF frequencies with low losses and high efficiency. There is a need in the art for a high Q value inductor that has a high resonance frequency and high inductance, and that occupies a minimal substrate area. In addition, there is a need for a process for fabricating such an inductor.

SUMMARY OF THE INVENTION

An inductor in an integrated circuit comprises a conductive trace disposed over an insulating layer which overlies a semiconductor substrate of a first conductivity type and at least two deep wells of opposite conductivity type in the substrate underneath the track. In another embodiment, an inductor in an integrated circuit comprises a conductive trace disposed over an insulating layer which overlies a semiconductor substrate of a first conductivity type; a shallow trench isolation region formed in the substrate underneath the trace; and at least two deep wells of opposite conductivity type in the substrate underneath the shallow trench isolation region. The present invention also includes methods of manufacturing the aforementioned inductors.

BRIEF DESCRIPTION OF THE DRAWINGS

A more complete understanding of the present invention can be obtained by reference to the detailed description of embodiments in conjunction with the accompanying drawings, in which.

DETAILED DESCRIPTION

Figure 1:
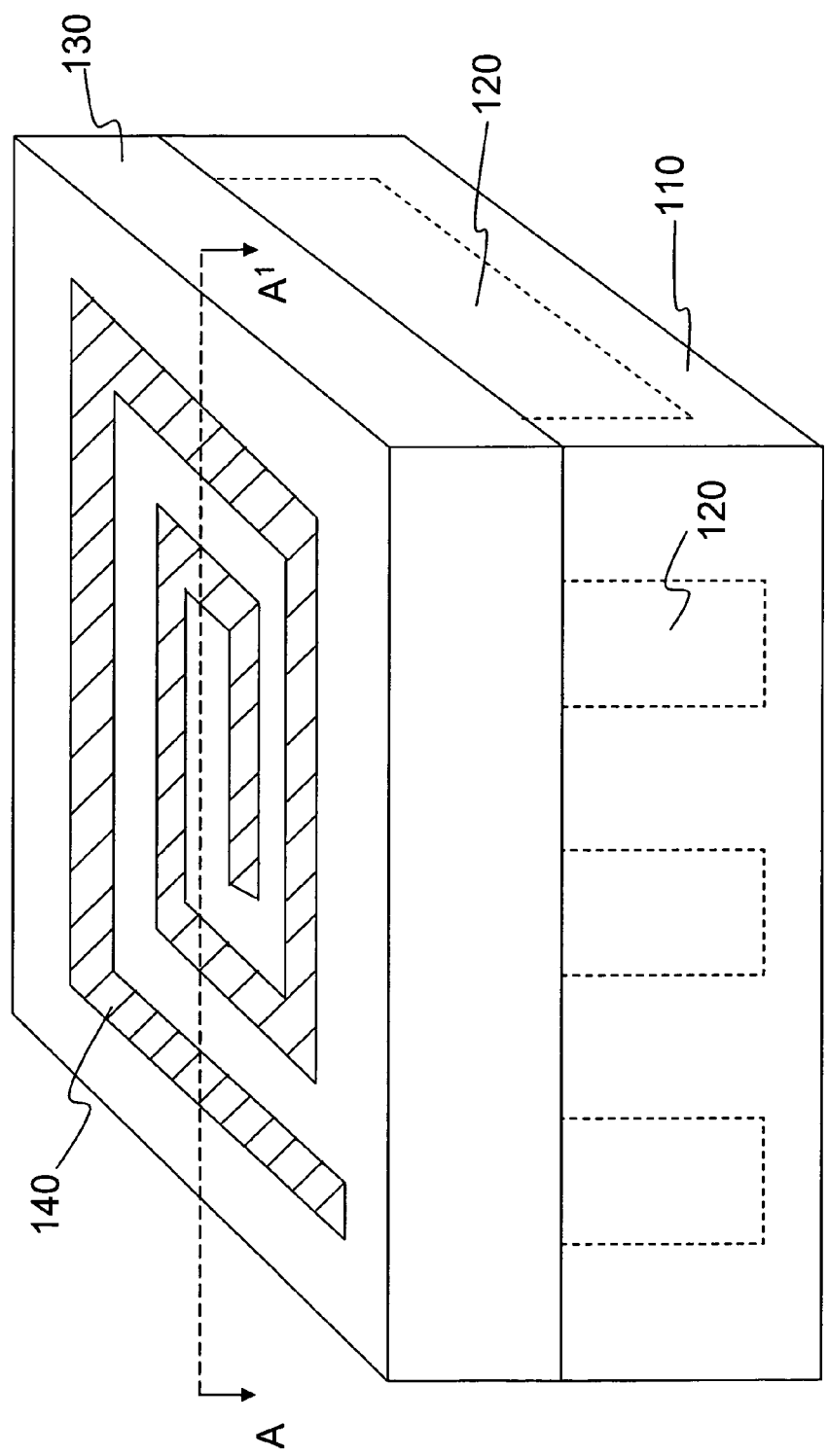
FIG. 1 illustrates an oblique plan view of an inductor with three deep n-type wells.

FIG. 1 illustrates an exemplary embodiment of the present invention. An inductor 100 has a conductive trace 140 disposed over an insulating layer 130. The insulating layer 130 is formed over a substrate 110. Three deep n-type wells 120 are formed in the substrate 110 underneath the trace 140. In other embodiments, deep p-type wells are formed in an n-type semiconductor substrate.

The conductive trace 140 has multiple straight segments forming a rectangular-shaped spiral. In another embodiment, a conductive trace can be a circular-shaped spiral or polygonal-shaped spiral. The thickness of the insulating layer is about 6–8 microns. Three deep n-type wells 120 are cuboid and arranged to generate a substantial depletion region under the conductive trace 140.

The substrate 110 can be a p-type or n-type semiconductor substrate. The conductive trace 140 comprises aluminum, aluminum alloy including aluminum copper, copper, gold, silver, or doped polysilicon. The insulating layer 130 comprises silicon dioxide, silicon nitride, silicon oxynitride, phosphosilicate glass (PSG), borosilicate glass (BSG), boron phosphosilicate glass (BPSG), fluorinated silicate glass (FSG), or low k dielectric material with k value lower than about 3.2.

Figure 2:
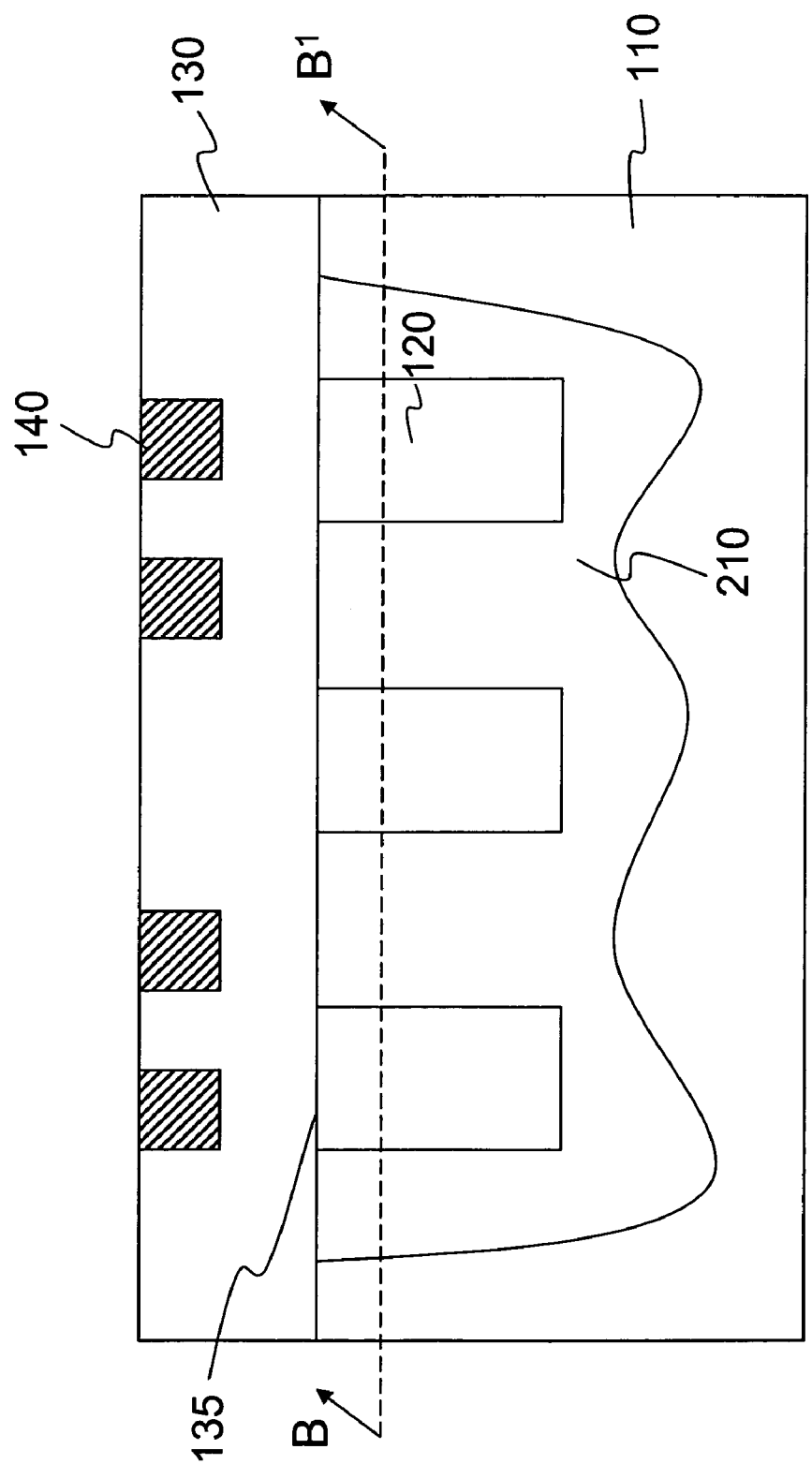
FIG. 2 illustrates a cross-sectional view of the inductor shown in FIG. 1.
Figure 3:
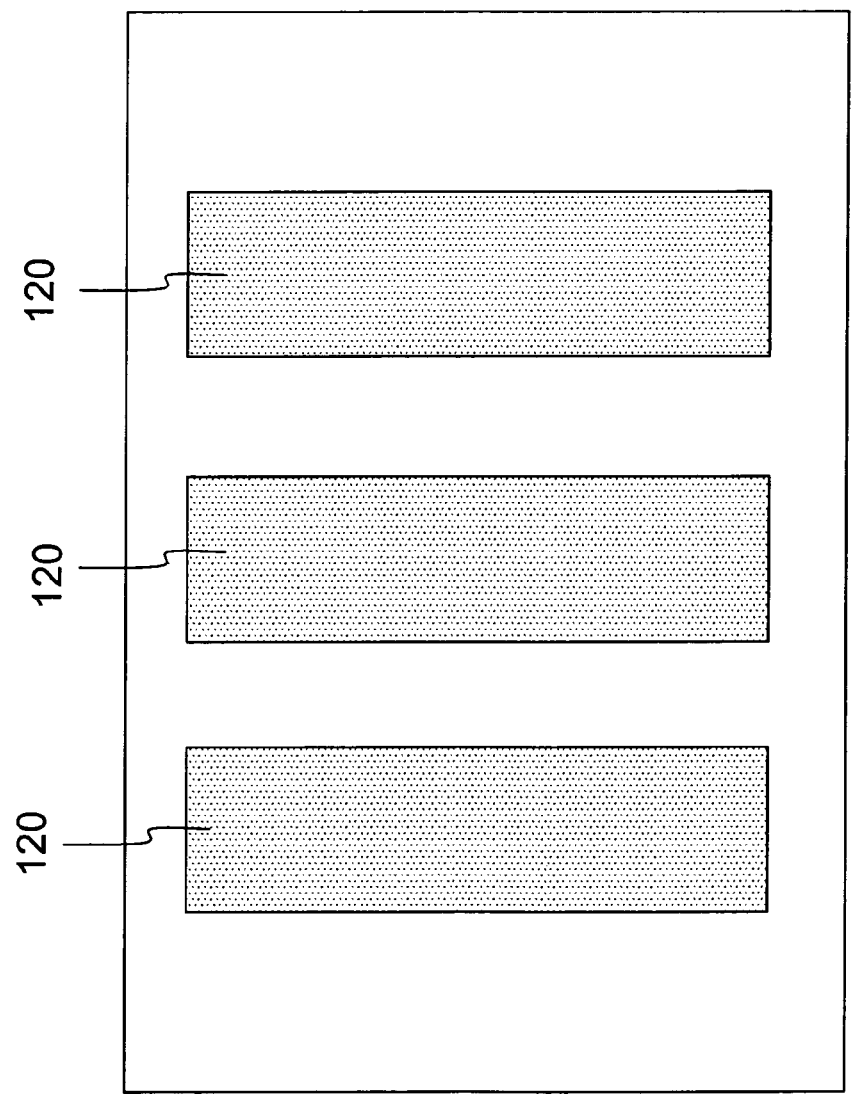
FIG. 3 illustrates a top view of deep wells in the inductor shown in FIG. 2.
Figure 4:
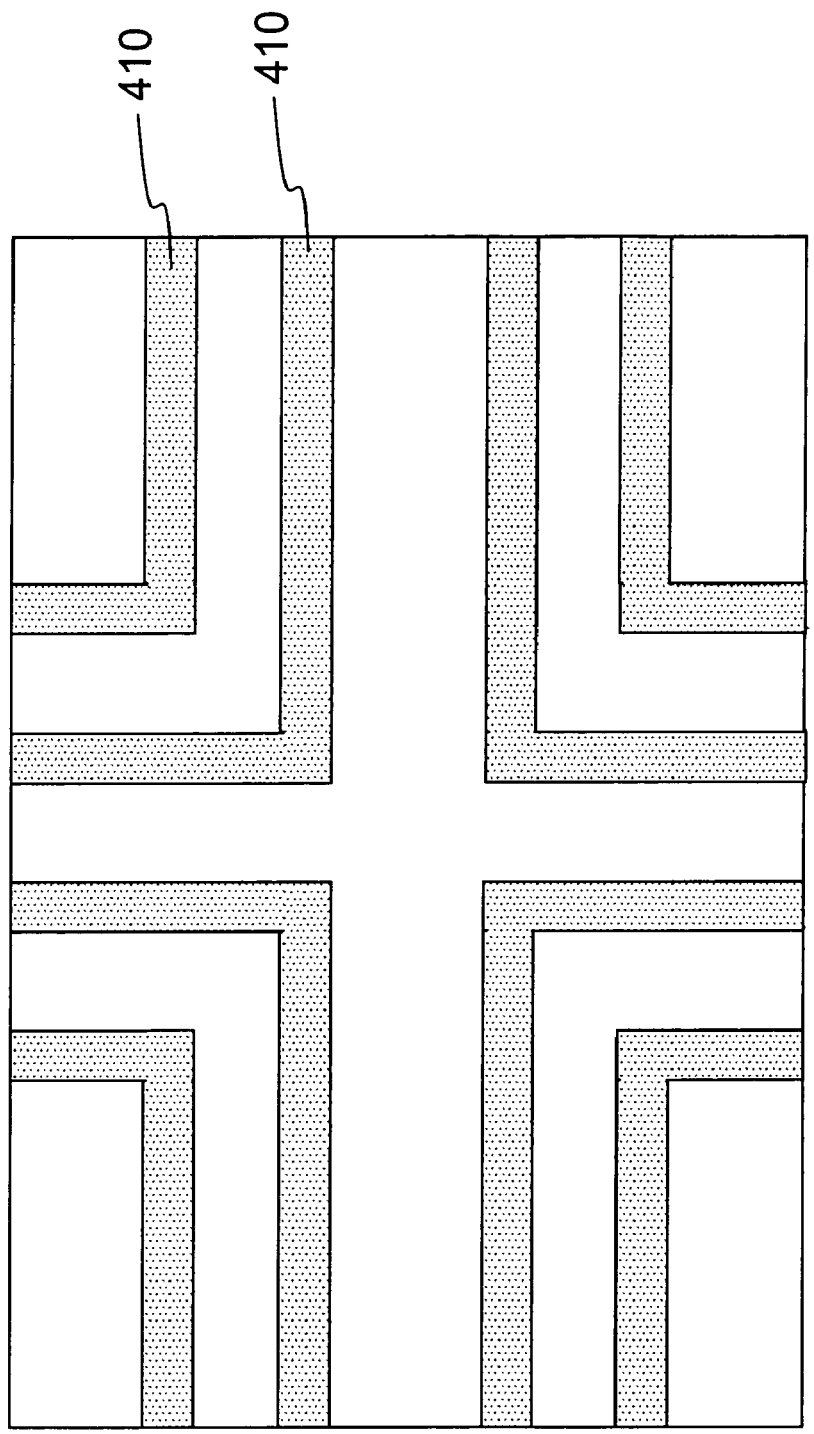
FIG. 4 illustrates a top view of an alternate pattern of deep wells in an inductor.

FIG. 2 is a cross-sectional view of the inductor in FIG. 1 cutting from the line AA', comprising the conductive trace 140, the insulating layer 130, three deep n-type wells 120 and the p-type substrate 110. In some embodiments, deep n-type wells 120 are continuous for at least 1.5 $\mu$m from a surface 135 of said substrate underneath said insulating layer 130. P-type dopant atoms such as boron are used to form p-type substrate 110. N-type dopant atoms such as antimony, arsenic, and phosphorus are implanted into p-type substrate 110 to form deep n-type wells 120. Extra electrons from deep n-type wells 120 diffuse toward the p-type substrate 110 and neutralize with extra hole in the p-type substrate 110. As a result, a substantial depletion region 210 without extra electrons or holes is created. The p-type substrate 110 and deep n-type wells 120 are connected to ground node. No reverse bias is required to obtain the depletion region 210. The embodiment illustrated in FIG. 2 has three deep n-type wells. From the top view as shown in FIG. 3, three deep n-type wells 120 are rectangular shaped. In other embodiments as illustrated in FIG. 4, the top view of deep wells can be a pattern comprising L shaped strips 410. This pattern arrangement may further obstruct the generation of Eddy current when small amount of carriers still exist. The number of deep wells needed to create a depletion region underneath the trace depends on the geometry of wells and concentration of dopants. The depletion width around NP junction can be calculated in accordance with the following equation:

$$W = \{2(e_s/q) \; [(N_A + N_D)/(N_A \cdot N_D)] V_{bi}\}^{1/2}$$

$e_s$: Semiconductor permittivity $N_A$: Acceptor concentration (P-type)

$N_D$: Donor concentration (N-type)

$V_{bi}$: Built-in potential (at thermal equilibrium)

q: Magnitude of electronic charge

The Q value of an inductor is improved because a depletion region without carriers eliminates or reduces Eddy currents formed in the substrate which consumes energy stored in the inductor and offsets the inductance value. In addition, the capacitance resulting from the depletion region couples in series with the parasitic capacitance attributed to the insulating layer between the conductive trace and the substrate to decrease the total capacitance. The reduction in the total capacitance leads to an increase in the self-resonance frequency and Q value.

Figure 5:
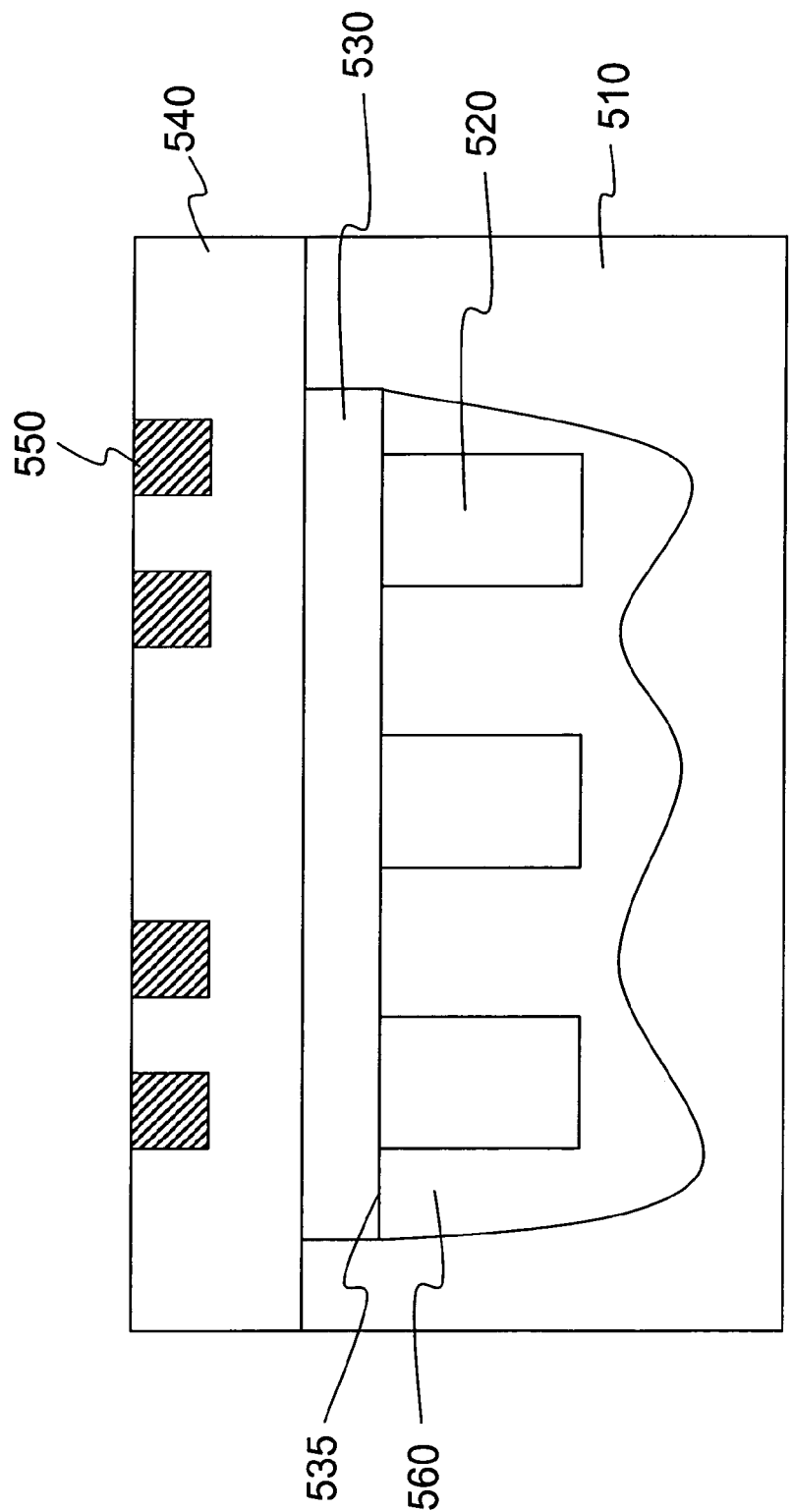
FIG. 5 illustrates a cross-sectional view of an inductor with both shallow trench isolation region and deep wells.
Figure 6:
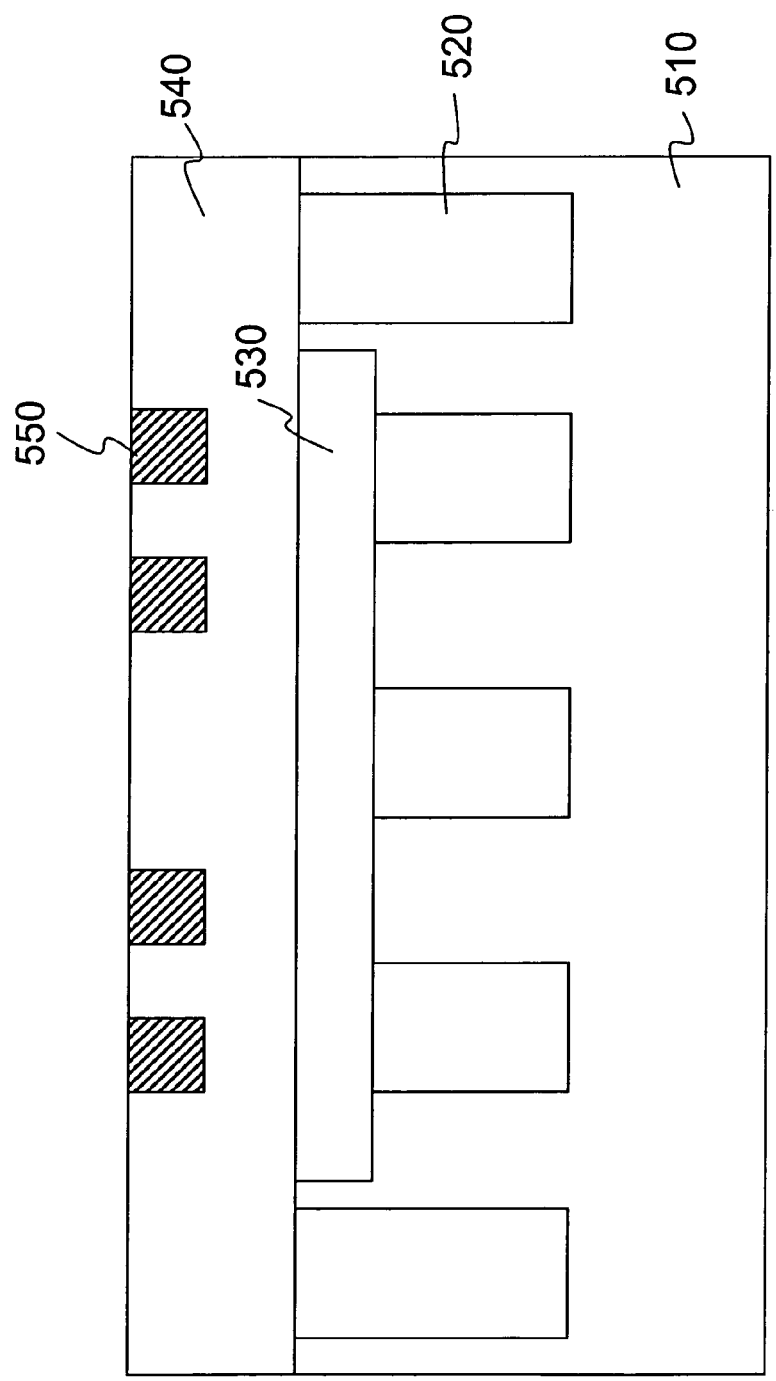
FIG. 6 illustrates a cross-sectional view of an inductor with two more deep wells than the inductor shown in FIG. 5.

As shown in FIG. 5, an alternative embodiment of the present invention has a conductive trace 550 disposed over an insulating layer 540. The insulating layer 540 is formed over a p-type semiconductor substrate 510. A shallow trench isolation region 530 is formed in the substrate 510 underneath the trace 550. Three deep n-type wells are formed in the substrate 510 underneath the shallow trench isolation region 530. A substantial completion region 560 is then created. In another embodiment as shown in FIG. 6, two more deep wells for eliminating substrate coupling effect can be formed in the substrate outside the shallow trench isolation region but directly underneath the insulating layer to expand the depletion region.

The conductive trace 550 has multiple straight segments forming a rectangular-shaped spiral. In another embodiment, a conductive trace can be a circular-shaped spiral or polygonal-shaped spiral. The conductive trace 550 comprises aluminum, aluminum alloy including aluminum copper, copper, gold, silver, or doped polysilicon. The insulating layer 130 comprises silicon dioxide, silicon nitride, silicon oxynitride, phosphosilicate glass (PSG), borosilicate glass (BSG), boron phosphosilicate glass (BPSG), fluorinated silicate glass (FSG), or low k dielectric material with k value lower than about 3.2. The thickness of the insulating layer is about 6–8 microns. The shallow trench isolation region 120 comprises silicon dioxide. The thickness of the shallow trench isolation region 120 is about 0.4 micron. P-type dopant atoms such as boron are used to form p-type substrate 510. N-type dopant atoms such as antimony, arsenic, and phosphorus are implanted to form deep n-type wells 520.

The addition of shallow trench isolation can further improve Q value of a conductor. The capacitance resulting from the shallow trench isolation region couples in series with the parasitic capacitance attributed to the insulating layer between the conductive trace and the substrate to decrease the total capacitance. The reduction in the total capacitance increases the self-resonance frequency and the Q (quality factor) value of the inductor.

Figure 7A:
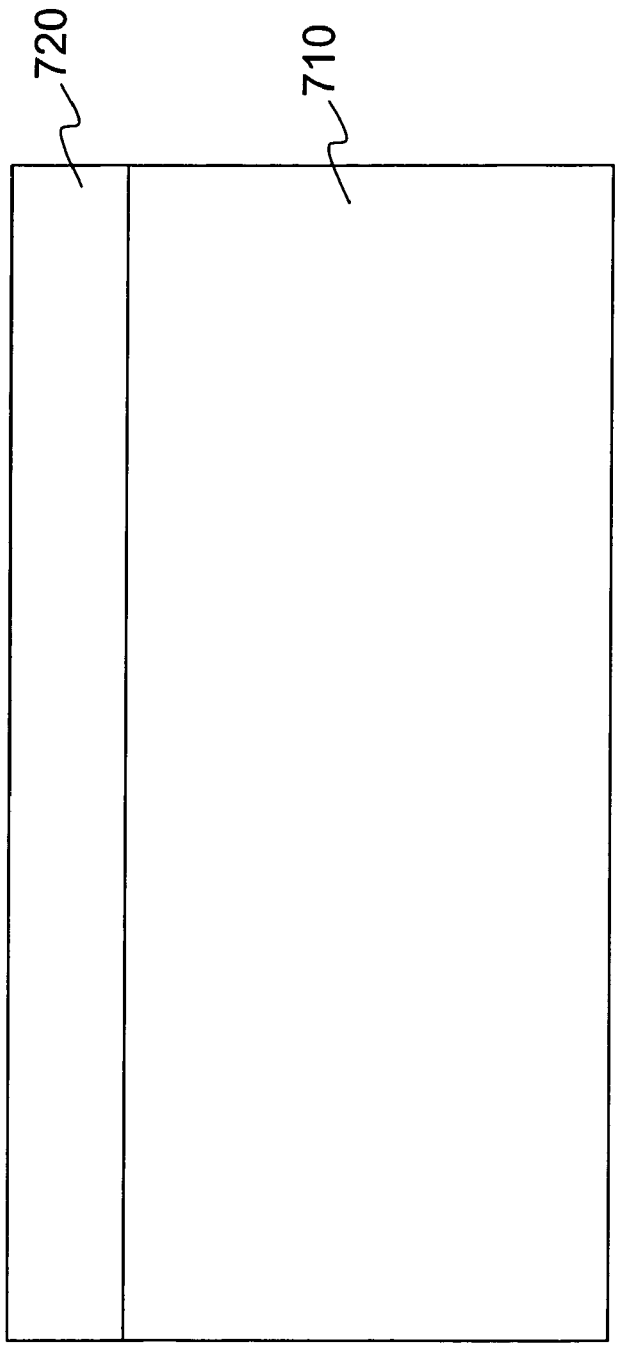
FIG. 7A to 7F illustrate steps of manufacturing the inductor with deep wells as shown in FIG. 2.
Figure 7B:
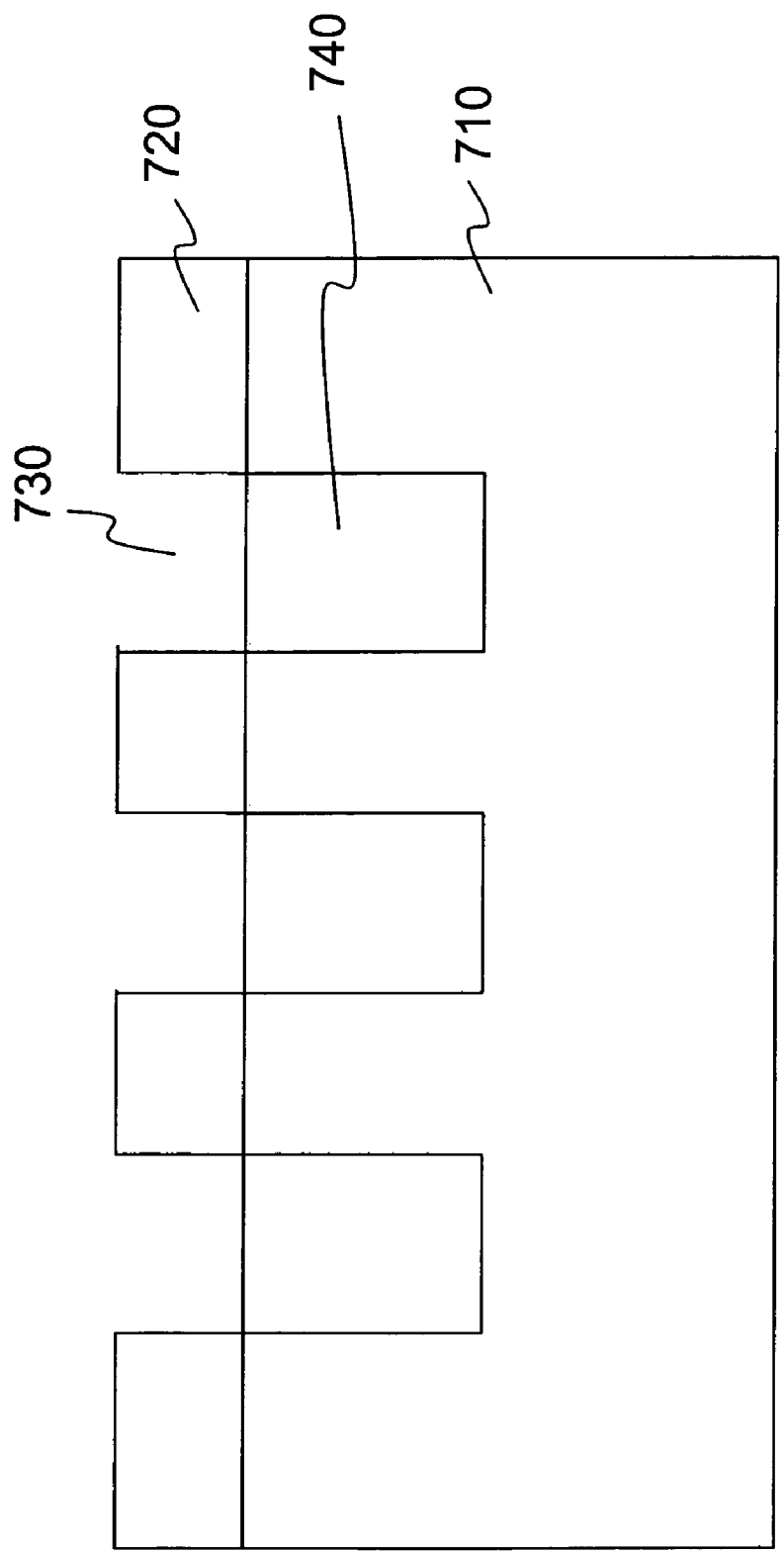

FIG. 7A–7F illustrate an exemplary method of manufacturing the inductor shown in FIGS. 1 and 2. In FIG. 7A, a layer of resist material 720 is deposited, for example, by spinning on a p-type semiconductor substrate 710. In FIG. 7B, by applying a conventional photolithographic technology, the resist layer 720 is exposed to form the pattern of three deep n-type wells. After development, openings 730 are formed in the resist layer 720. N-type dopant atoms such as antimony, arsenic, and phosphorus are doped into the p-type semiconductor substrate 710 from openings 730 by diffusion or ion implantation. For example, during the process of ion implantation, implant sources of $PF_3$ are ionized; $P^+$ ion is selected by a mass analyzer and accelerated to a desired energy level; and then the $P^+$ ion beams hit openings 730 to form deep n-type wells.

In some embodiments, deep n-type wells 520 are continuous for at least 1.5 $\mu$m from a plane 535 in the substrate 510 underneath and adjacent to the shallow trench isolation region 530. In order to form continuous deep n-type wells, two or more stages of ion implantation are preferred. In an embodiment, three stages of ion implantation are employed. In the first stage, $P^+$ ions accelerated to the first energy level approximately ranging from 600 to 1200 KeV are introduced into p-type substrate and stay in the deepest region of deep n-type wells. Then, in the second stage, $P^+$ ions accelerated to the second energy level approximately ranging from 350 to 500 KeV are introduced into p-type substrate and stay in about the middle region of deep n-type wells. Lastly, in the third stage, $P^+$ ions accelerated to the third energy level approximately ranging from 150 to 250 KeV are introduced into the p-type substrate and stay in the shallower region of deep n-type wells. In an alternate embodiment, two stages of ion implantation are used. In the first stage, $P^+$ ions accelerated to the first energy level approximately ranging from 500 to 800 KeV are introduced into p-type substrate and stay in the deeper region of deep n-type wells. Then, in the second stage, $P^+$ ions accelerated to the second energy level approximately ranging from 200 to 350 KeV are introduced into p-type substrate and stay in shallower region of deep n-type wells. Afterwards, these ion implants are diffused into neighboring regions to form a continuous distribution along deep wells.

Figure 7C:
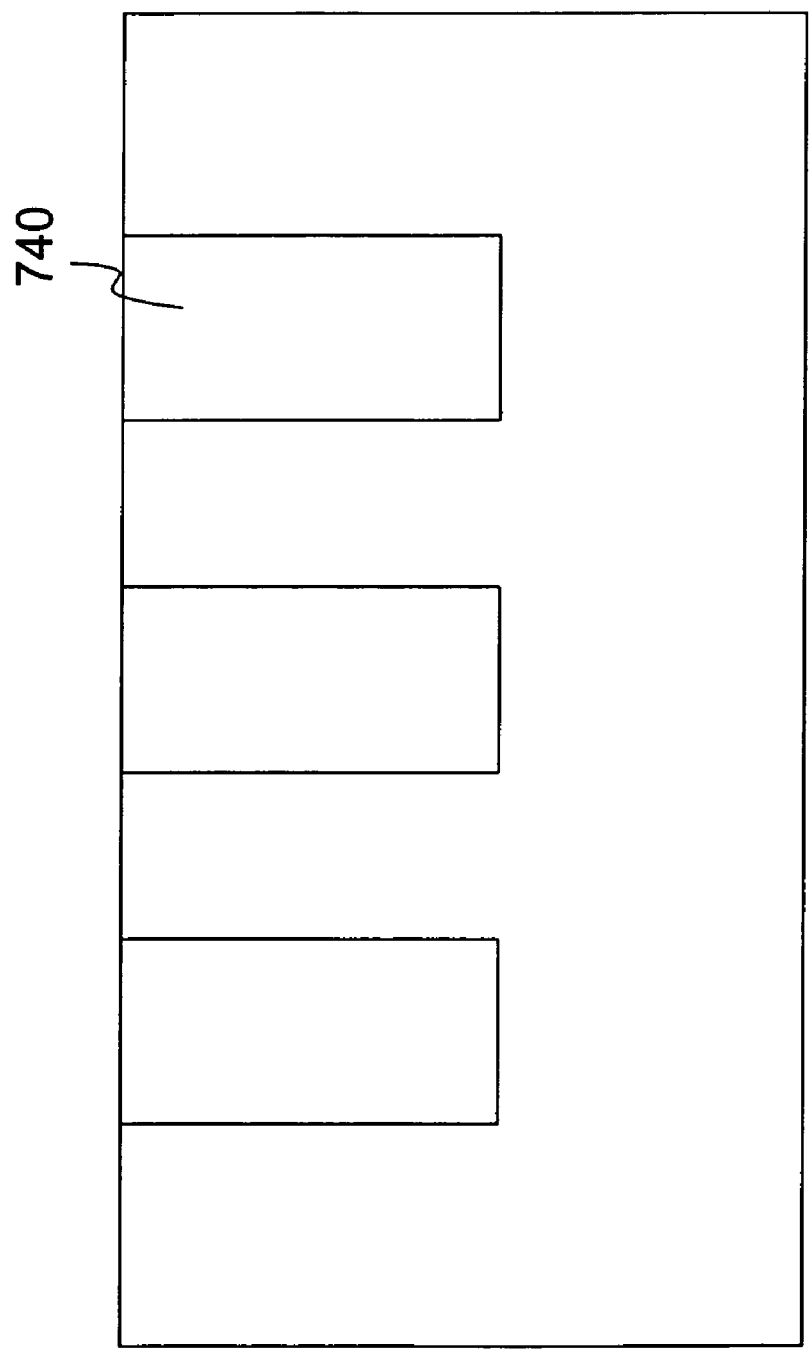
Figure 7D:
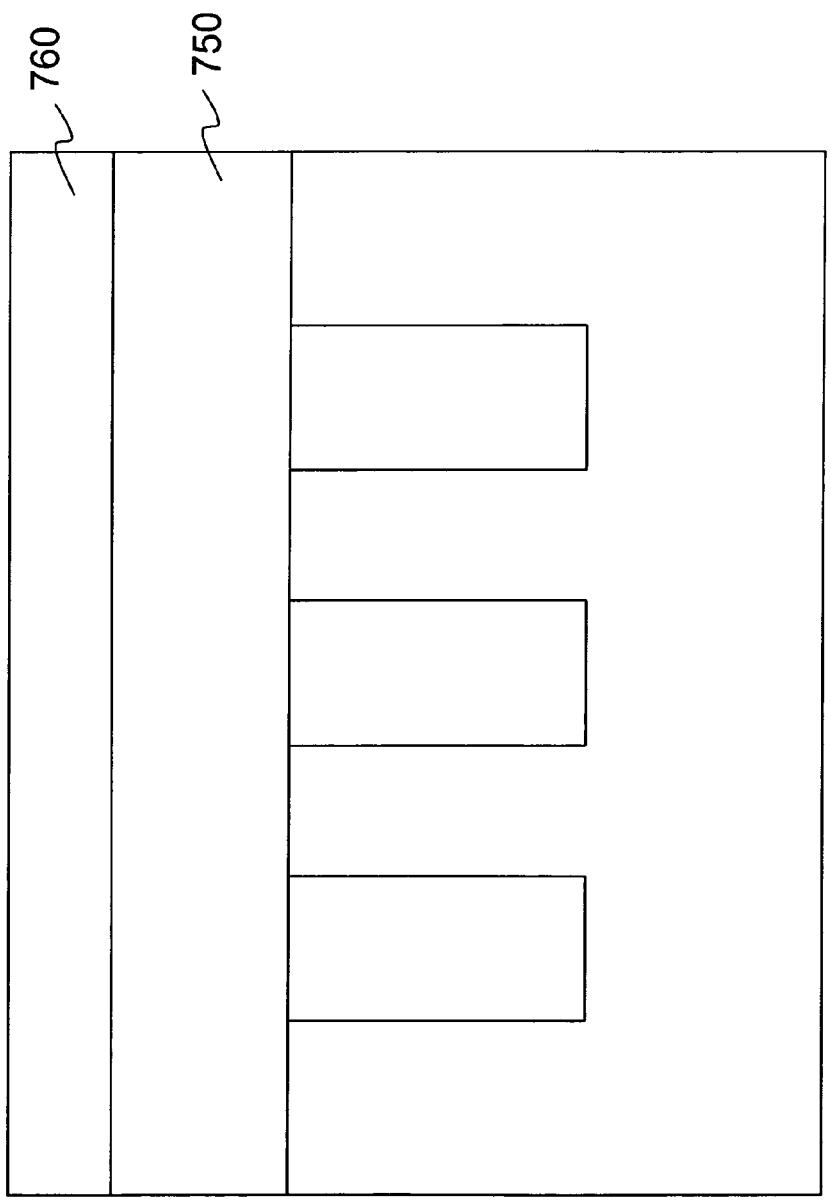
Figure 7E:
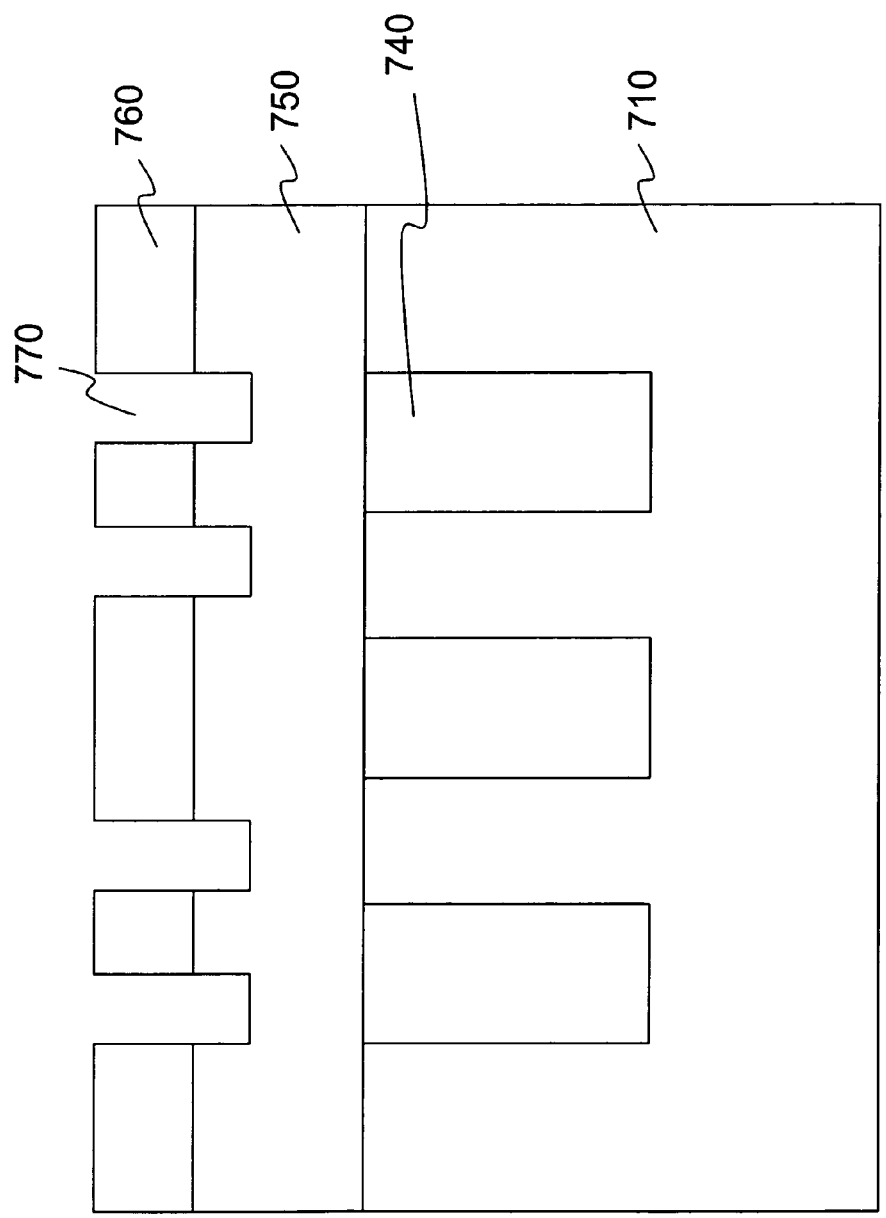
Figure 7F:
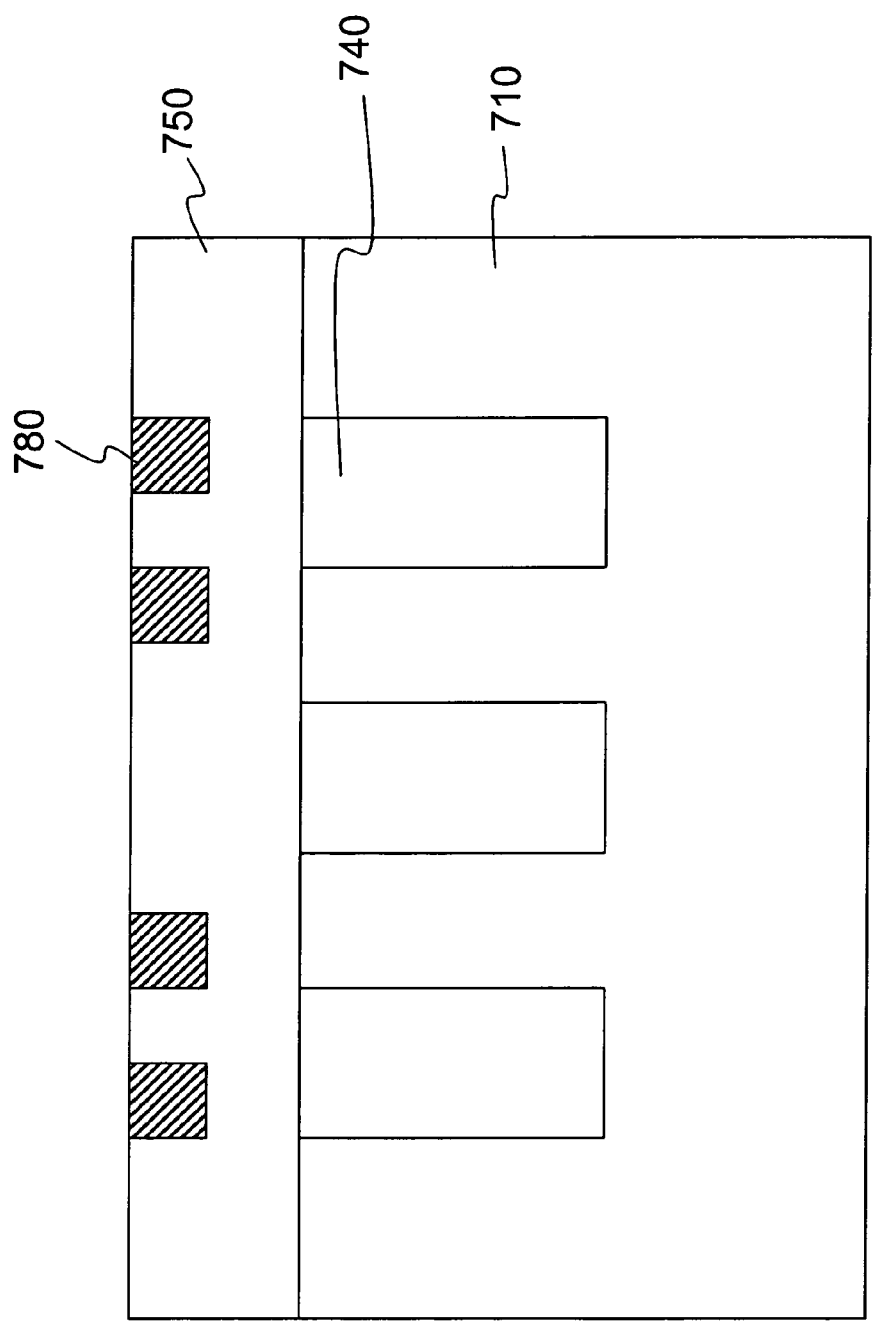

After three deep n-type wells 740 are formed, the remaining portion of the resist layer 720 is removed as shown in FIG. 7C. In FIG. 7D, an insulating layer 750 is formed over the substrate 710. For example, a layer of silicon dioxide is deposited by chemical vapor deposition (CVD). Another layer of resist 760 is then formed over the insulating layer 750. In FIG. 7E, through exposure, development, and etching, openings 770 in the insulating layer 750 are left. In FIG. 7F, the remaining of the resist layer 760 is removed. Conductive material such as copper is then deposited to fill openings 770 by electroplating to form a conductive trace 780. The upper surface of the dielectric layer 750 is then planarized by chemical mechanical polishing (CMP).

Figure 8A:
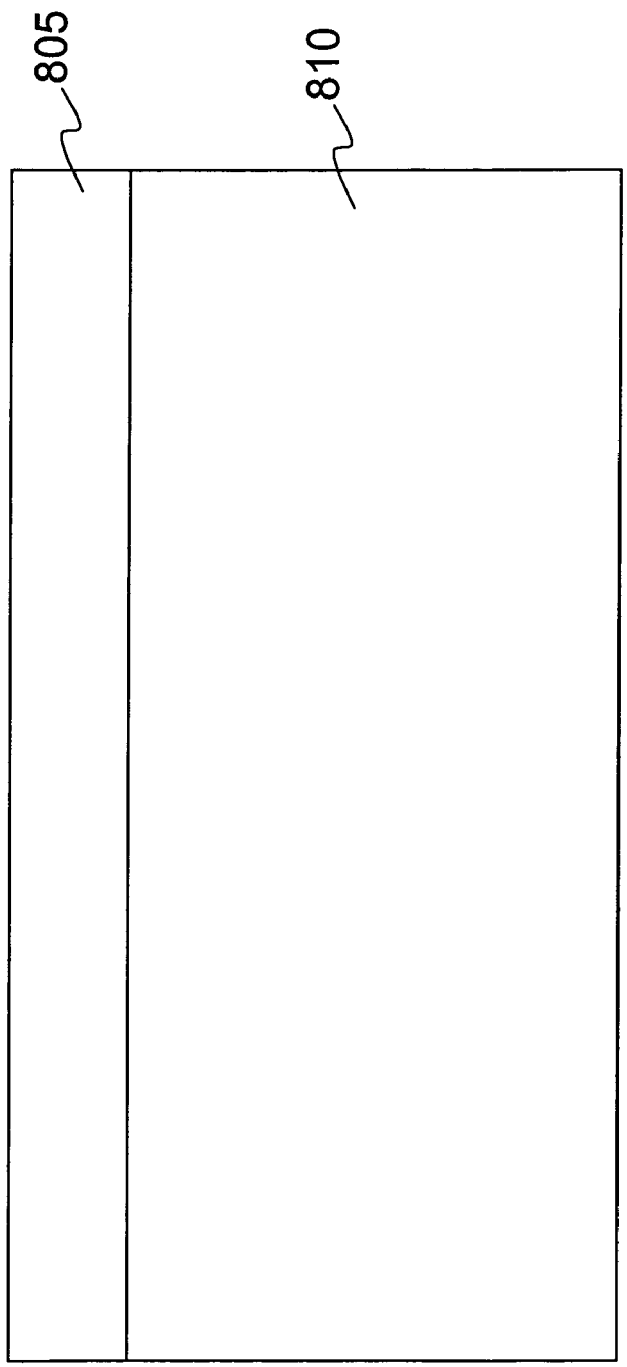
FIG. 8A to 8H illustrate steps of manufacturing the inductor with both shallow trench isolation region and deep wells as shown in FIG. 5.
Figure 8B:
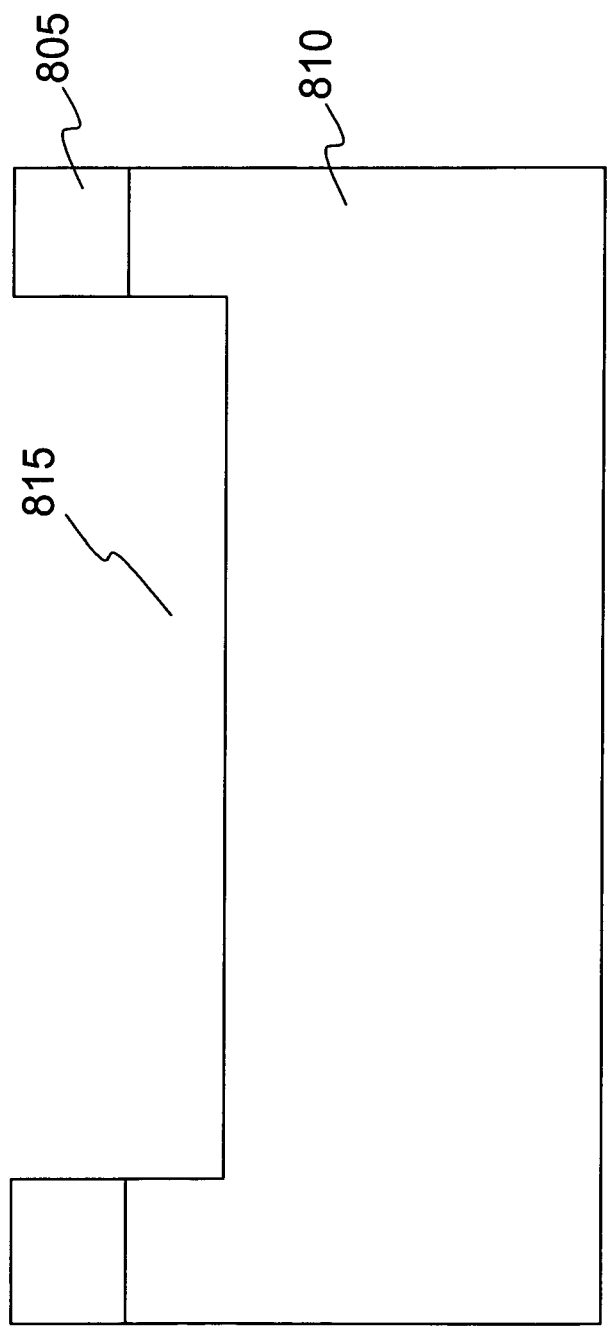
Figure 8C:
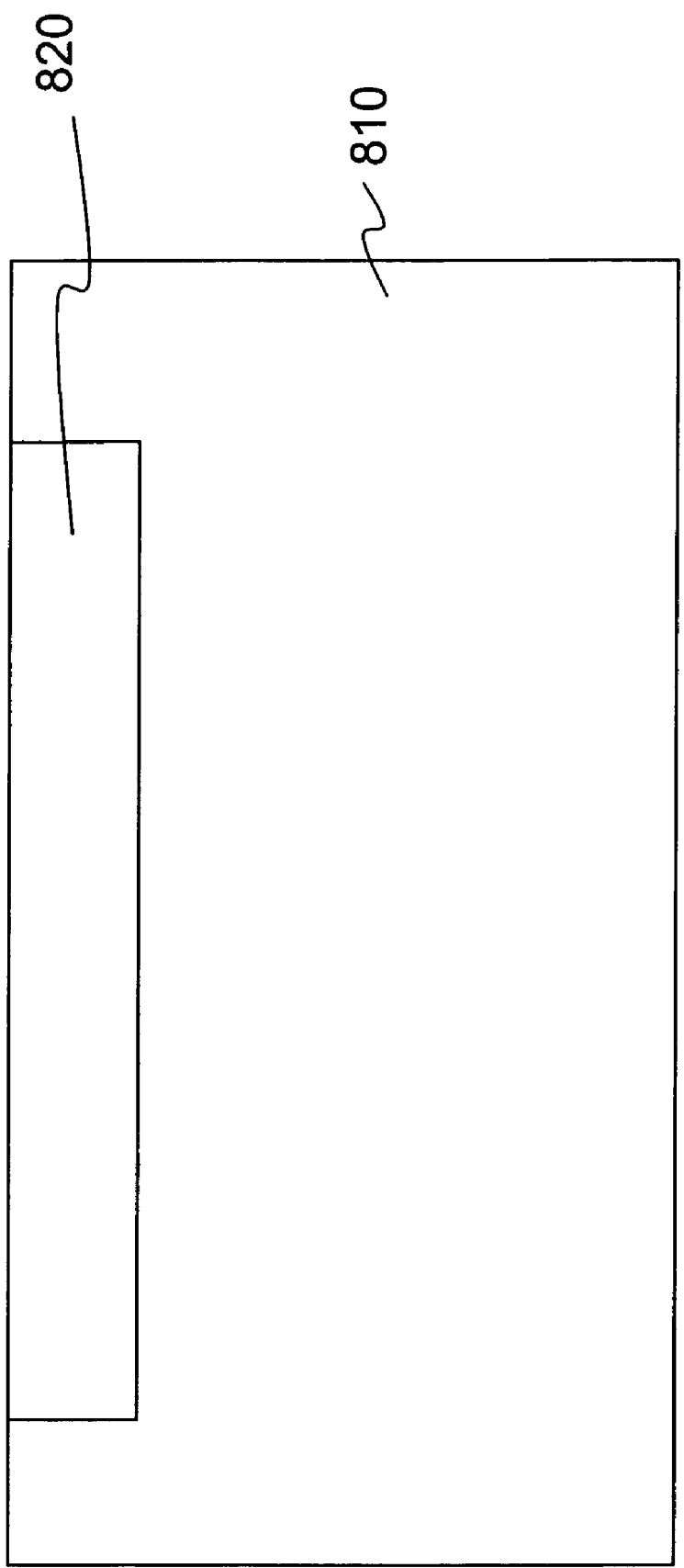

FIG. 8A–8H illustrate an exemplary method of manufacturing the inductor having both shallow trench isolation region and deep n-type wells as shown in FIGS. 5 and 6. In FIG. 8A, a layer of resist material 805 is deposited, for example, by spinning on a substrate 810. The resist material 805 can be a positive resist or a negative resist. In FIG. 8B, by applying a conventional photolithographic technology, the resist layer 805 is exposed to form the pattern of a shallow trench isolation region. The exposure sources can be radiation such as I line at 365 nm and deep ultraviolet at 193 nm. After development and etching, opening 815 is formed in the substrate 810. In FIG. 8C, the remaining resist material is removed and the opening 815 is filled with silicon dioxide ($SiO_2$) to form the shallow trench isolation region 820.

Figure 8D:
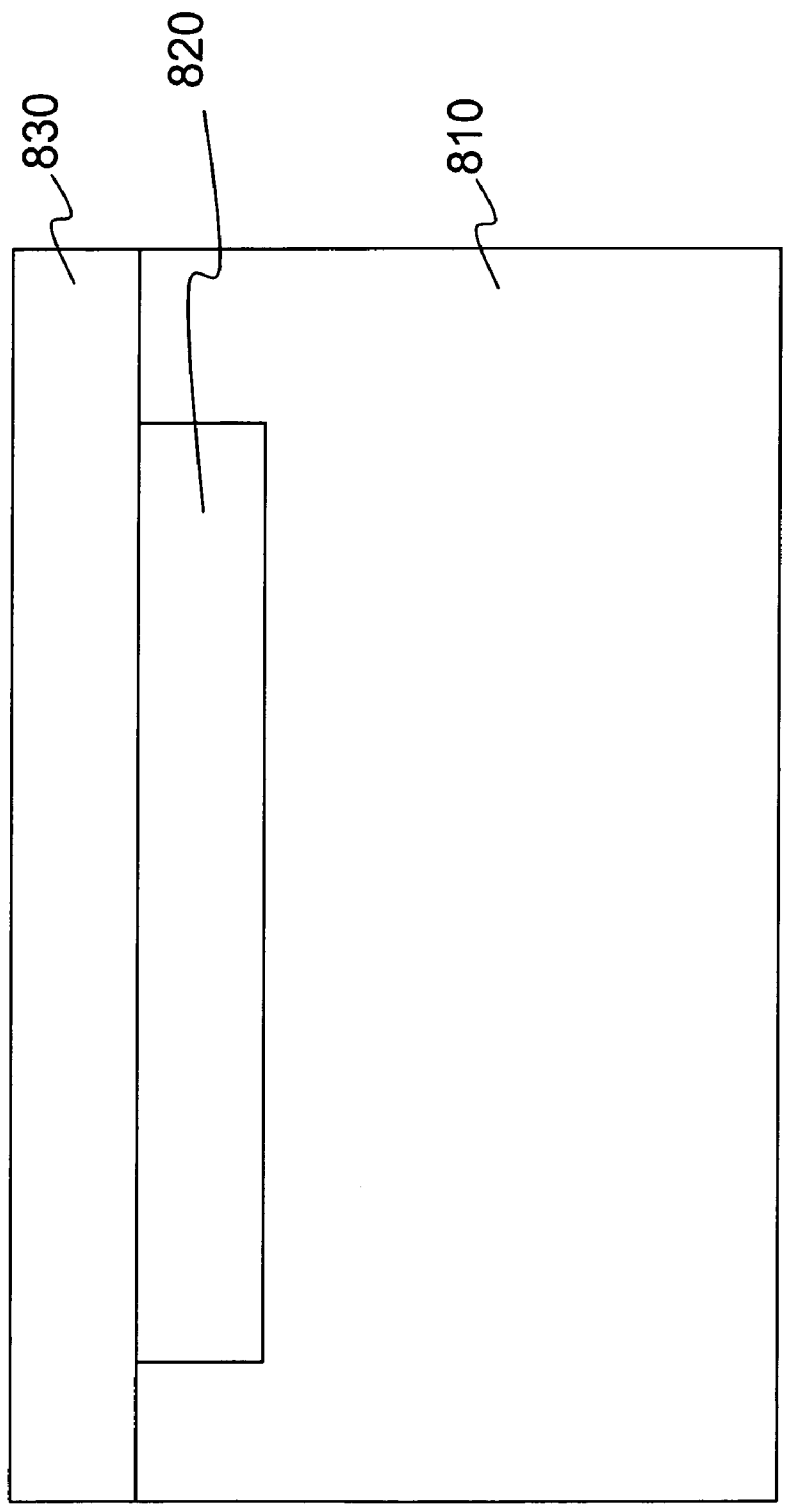
Figure 8E:
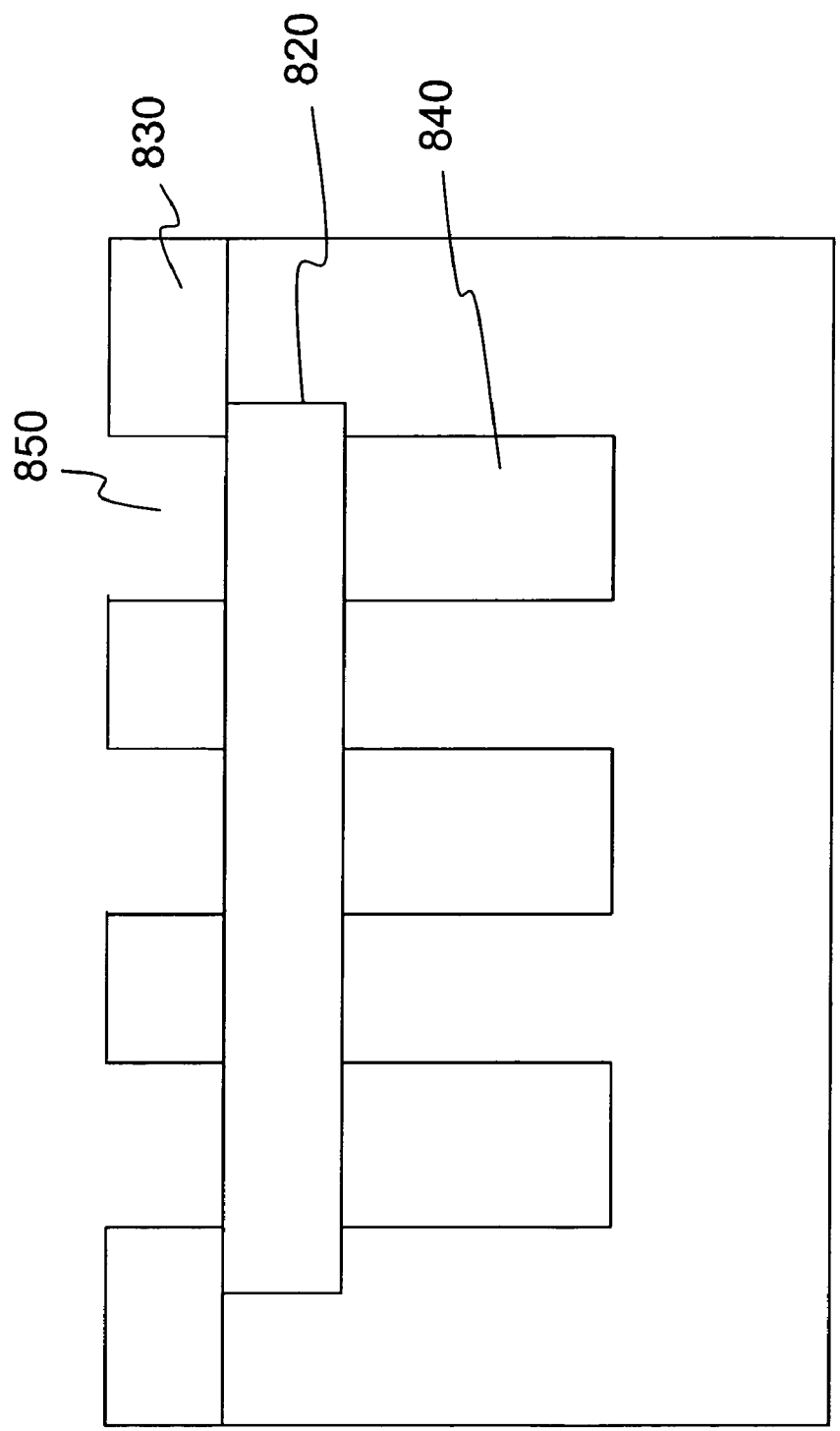

In FIG. 8D, a second resist layer 830 is formed over the substrate 810 by, for example, spinning. In FIG. 8E, by applying a conventional photolithographic technology, the resist layer 830 is exposed to form the pattern of three deep n-type wells. After development, openings 850 are formed in the resist layer 830. N-type dopant atoms are then implanted into the substrate 810 from openings 850. With appropriate energy level, n-type dopant ion beams can traverse the shallow trench isolation region 820 to form deep wells underneath. The remaining portion of the resist layer 830 is then removed.

Figure 8F:
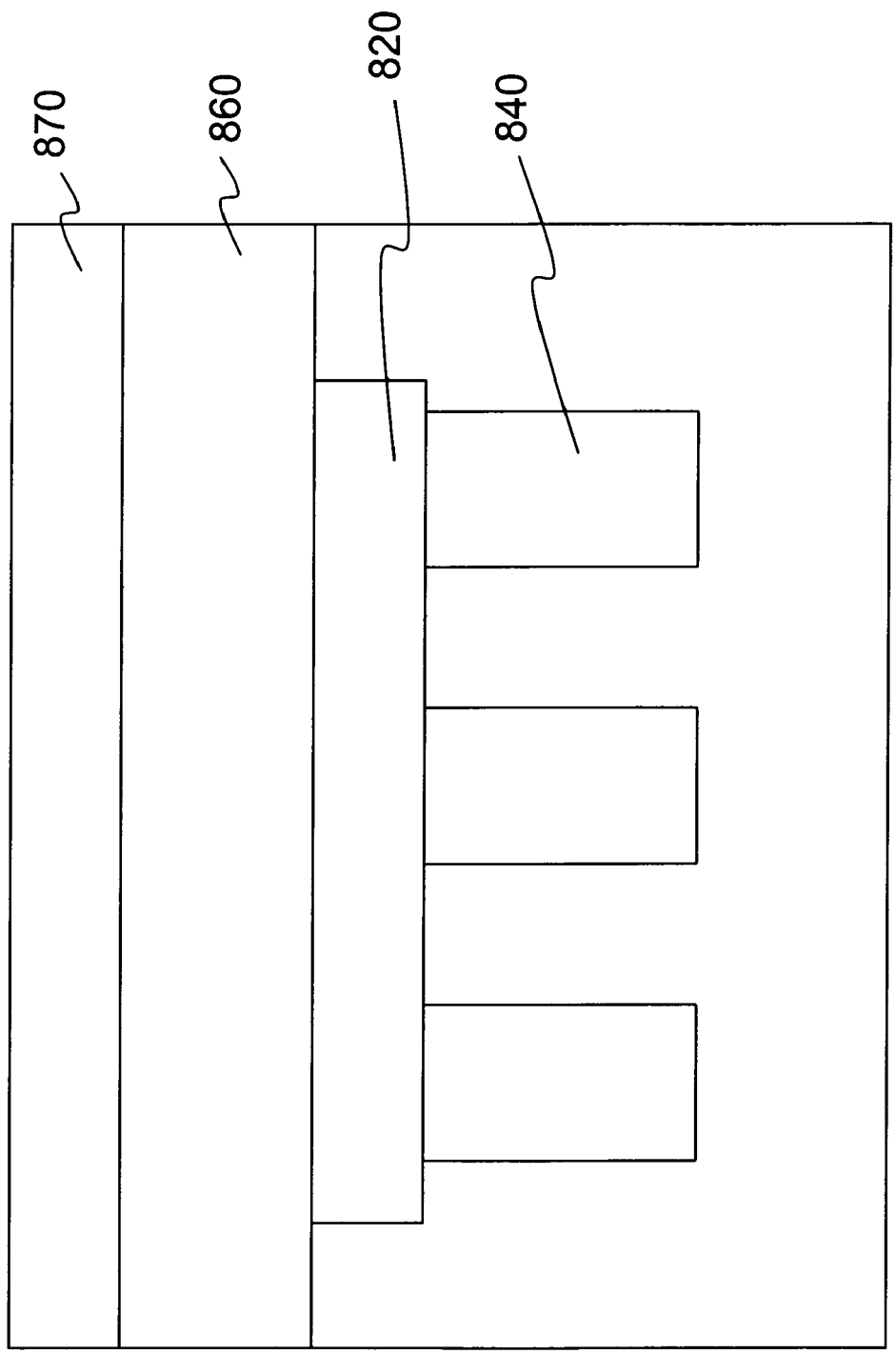
Figure 8G:
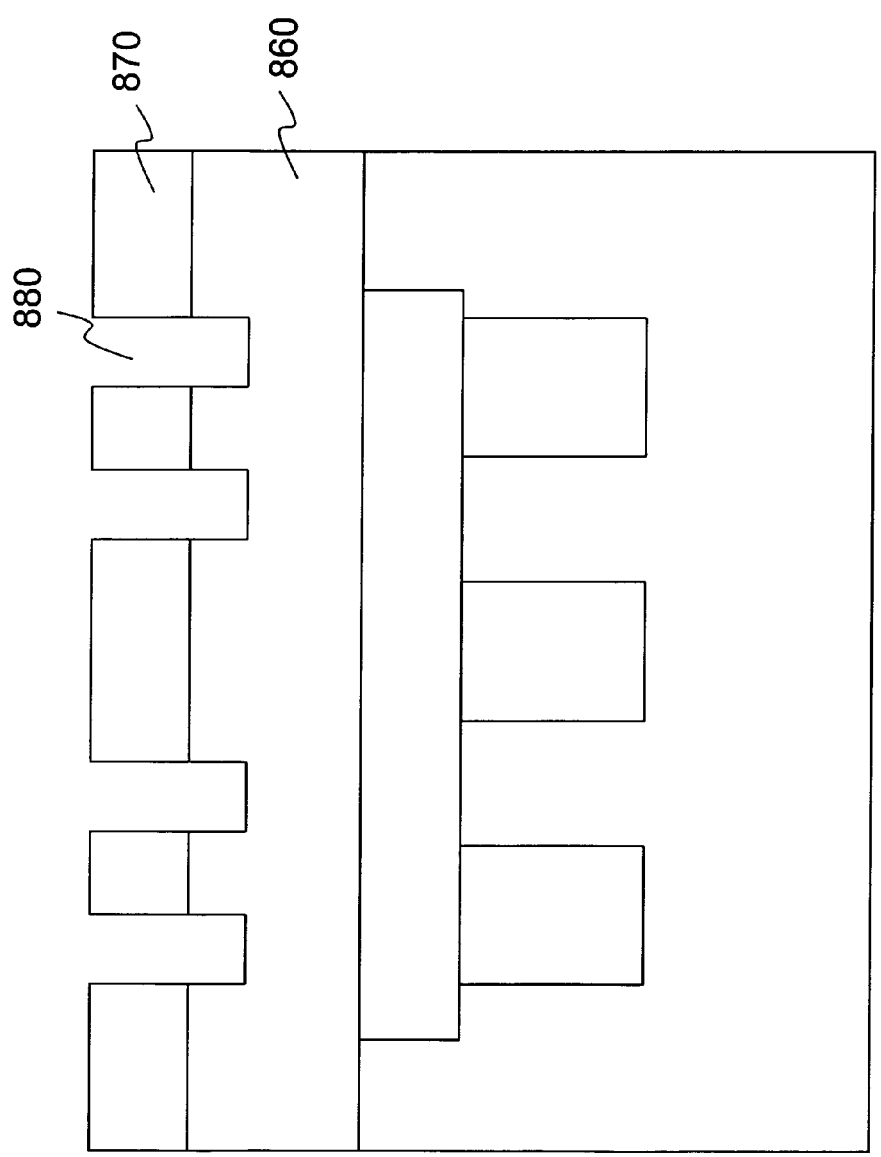
Figure 8H:
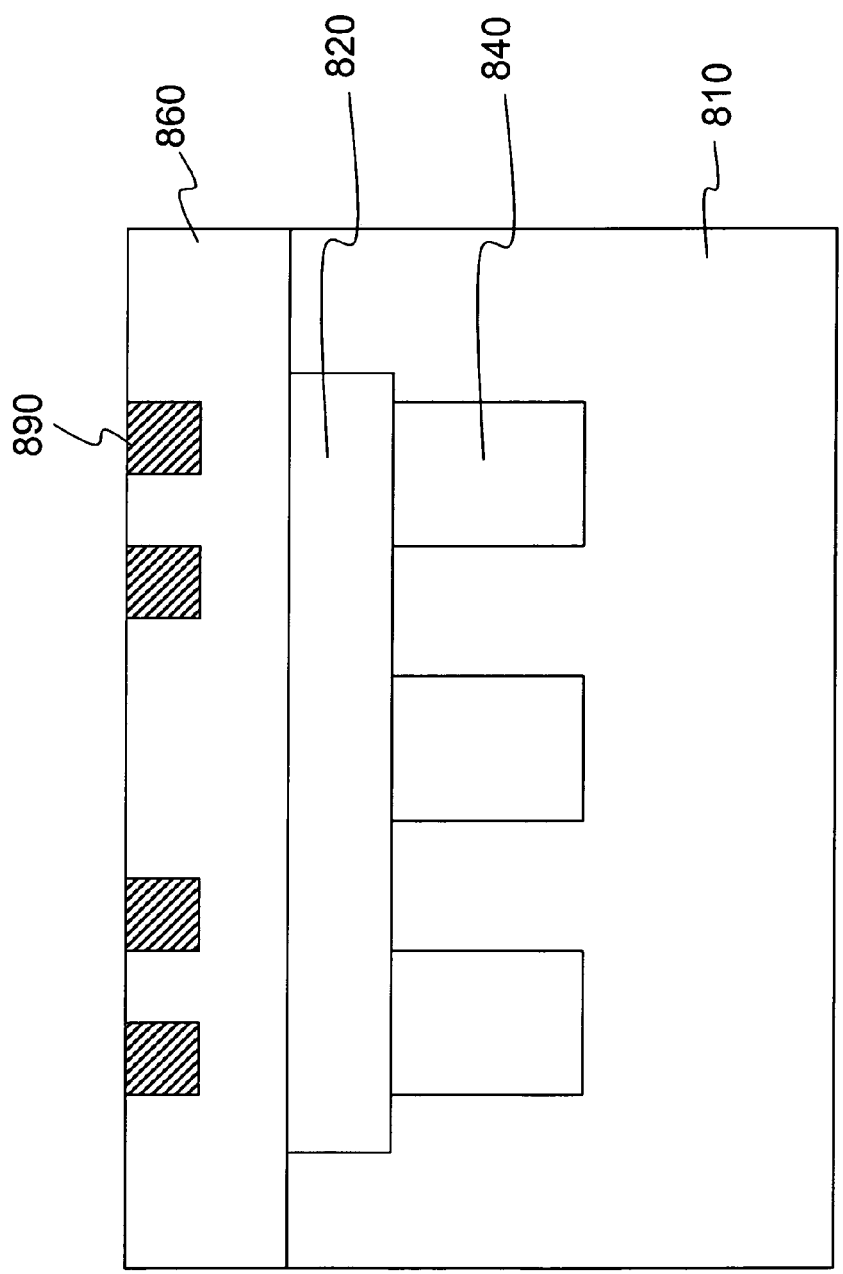

In FIG. 8F, an insulating layer 860 is formed over the substrate 810. For example, a layer of silicon dioxide is deposited by chemical vapor deposition (CVD). Other materials such as silicon nitride, silicon oxynitride, phosphosilicate glass (PSG), borosilicate glass (BSG), boron phosphosilicate glass (BPSG), fluorinated silicate glass (FSG), or low k dielectric material with k value lower than about 3.2 can also be used. Another layer of resist 870 is formed over the insulating layer 860. In FIG. 8G, through exposure, development, and etching, openings 880 in the insulating layer 860 are left. In FIG. 8H, the remaining of the resist layer 870 is removed. Conductive material such as copper is then deposited to fill openings 880 by electroplating to form a conductive trace 890. The upper surface of the dielectric layer 860 is then planarized by chemical mechanical polishing (CMP).

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An inductor in an integrated circuit, comprising:
    a conductive trace disposed over an insulating layer, said insulating layer overlying a semiconductor substrate of a first conductivity type; and
    at least two deep wells of opposite conductivity type in said substrate underneath said trace, wherein said deep wells are continuous for at least 1.5 $\mu$m approximately from a surface of said substrate underneath said insulating layer.

2. The inductor of claim 1 wherein said conductive trace comprises metal.

3. The inductor of claim 1 wherein said semiconductor substrate is a p-type substrate and said deep wells are n-type wells.

4. The inductor of claim 1 wherein said semiconductor substrate is an n-type substrate and said deep wells are p-type wells.

5. The inductor of claim 1 wherein said deep wells are not reverse biased.

6. The inductor of claim 1 wherein said deep wells are arranged in a pattern to form a substantial depletion space in said substrate underneath said trace.

7. The inductor of claim 1 wherein said deep wells are cuboid.

8. The inductor of claim 1 wherein said deep wells are L shaped cuboid.

9. The inductor of claim 1 wherein said deep wells are formed by ion implantation.

10. The inductor of claim 9 wherein said ion implantation comprises a first stage in which ions are accelerated to a first energy level and at least a second stage in which ions are accelerated to an energy level different from said first energy level.

11. An inductor in an integrated circuit, comprising:
    a conductive trace disposed over an insulating layer, said insulating layer overlying a semiconductor substrate of a first conductivity type;
    a shallow trench isolation region, formed in said substrate underneath said trace; and
    at least two deep wells of opposite conductivity type in said substrate underneath said shallow trench isolation region.

12. The inductor of claim 11 wherein said conductive trace comprises metal.

13. The inductor of claim 11 wherein said shallow trench isolation comprises silicon dioxide.

14. The inductor of claim 11 wherein said semiconductor substrate is a p-type substrate and said deep wells are n-type wells.

15. The inductor of claim 11 wherein said semiconductor substrate is an n-type substrate and said deep wells are p-type wells.

16. The inductor of claim 11 wherein said deep wells are not reverse biased.

17. The inductor of claim 11 wherein said deep wells are arranged in a pattern to form a substantial depletion space in said substrate underneath said trace.

18. The inductor of claim 11 wherein said deep wells are cuboid.

19. The inductor of claim 11 wherein said deep wells are L shaped cuboid.

20. The inductor of claim 11 wherein said deep wells are continuous.

21. The inductor of claim 20 wherein said deep wells are continuous for at least 1.5 $\mu$m approximately from a plane in said substrate underneath and adjacent to said shallow trench isolation region.

22. The inductor of claim 11 wherein said deep wells are formed by ion implantation.

23. The inductor of claim 22 wherein said ion implantation comprises a first stage in which ions are accelerated to a first energy level and at least a second stage in which ions are accelerated to an energy level different from said first energy level.

24. An inductor in an integrated circuit, comprising:
    a conductive trace disposed over an insulating layer, said insulating layer overlying a semiconductor substrate of a first conductivity type; and
    at least two deep wells of opposite conductivity type in said substrate underneath said trace, wherein said deep wells are not reverse biased.

* * * * *